US012628560B2

(12) United States Patent
Gibson et al.

(10) Patent No.: US 12,628,560 B2
(45) Date of Patent: May 12, 2026

(54) ABSORBER, A DETECTOR COMPRISING THE ABSORBER, AND A METHOD OF FABRICATING THE ABSORBER

(71) Applicant: UNIVERSITY OF THE WEST OF SCOTLAND, Paisley (GB)

(72) Inventors: Desmond Gibson, Paisley (GB); David Hutson, Paisley (GB); Shigeng Song, Paisley (GB)

(73) Assignee: UNIVERSITY OF THE WEST OF SCOTLAND, Paisley (GB)

( * ) Notice: Subject to any disclaimer, the term of this patent is extended or adjusted under 35 U.S.C. 154(b) by 284 days.

(21) Appl. No.: 18/299,885

(22) Filed: Apr. 13, 2023

(65) Prior Publication Data

US 2023/0284531 A1 Sep. 7, 2023

Related U.S. Application Data

(63) Continuation of application No. PCT/GB2021/052388, filed on Sep. 15, 2021.

(30) Foreign Application Priority Data

Oct. 13, 2020 (GB) ..................................... 2016210

(51) Int. Cl.

| | |
|---|---|
| *H10N 10/855* | (2023.01) |
| *G01J 5/08* | (2022.01) |
| *G01J 5/12* | (2006.01) |
| *G01J 5/34* | (2022.01) |
| *H10N 10/01* | (2023.01) |
| *H10N 10/851* | (2023.01) |

(52) U.S. Cl.
CPC .......... *H10N 10/855* (2023.02); *G01J 5/0853* (2013.01); *G01J 5/12* (2013.01); *G01J 5/34* (2013.01); *H10N 10/01* (2023.02); *H10N 10/8556* (2023.02)

(58) Field of Classification Search
None
See application file for complete search history.

(56) References Cited

U.S. PATENT DOCUMENTS

| | | | |
|---|---|---|---|
| 4,504,519 A | | 3/1985 | Zelez |
| 5,562,781 A | | 10/1996 | Ingram et al. |
| 5,989,693 A | | 11/1999 | Yamasaki et al. |

(Continued)

FOREIGN PATENT DOCUMENTS

| | | | | |
|---|---|---|---|---|
| CA | 2 939 489 A1 | 8/2015 | | |
| CN | 201273736 Y | * 7/2009 | ............... | F24J 2/055 |

(Continued)

OTHER PUBLICATIONS

Sun et al. ("Influence of Hydrogen Content on Optical and Mechanical Performances of Diamond-Like Carbon Films on Glass Substrate", Journal of Materials Engineering and Performance, N° 4, p. 1570-1577, 2016) (Year: 2016).*

(Continued)

*Primary Examiner* — Marcus H Taningco

(74) *Attorney, Agent, or Firm* — Ruggiero McAllister & McMahon LLC

(57) ABSTRACT

An absorber for absorbing electromagnetic radiation including a first layer with hydrogenated carbon, and a second layer with carbon, and the first layer is less absorbing than the second layer.

15 Claims, 7 Drawing Sheets

(56)         References Cited

U.S. PATENT DOCUMENTS

| | | |
|---|---|---|
| 2002/0041930 A1 | 4/2002 | Erdemir et al. |
| 2013/0025643 A1 | 1/2013 | Mahrize |
| 2020/0152679 A1 | 5/2020 | Sato et al. |

FOREIGN PATENT DOCUMENTS

| | | | |
|---|---|---|---|
| CN | 107314559 A | | 11/2017 |
| CN | 108645061 A | * | 10/2018 |
| DE | 32 37 851 A1 | | 4/1983 |
| GB | 2561865 A | | 10/2018 |
| JP | 8 62-217245 A | | 9/1987 |
| JP | 2016-45372 A | | 4/2016 |

OTHER PUBLICATIONS

International Search Report dated Jan. 28, 2022 from corresponding International Patent Application No. PCT/GB2021/052388, 7 pages.
Written Opinion dated Jan. 28, 2022 from corresponding International Patent Application No. PCT/GB2021/052388, 11 pages.
Search Report dated Mar. 19, 2021 from corresponding Great Britain Application No. 2016210.3, 1 page.
Lenggenhager et al.; "Thermoelectric infrared sensors in CMOS technology"; Sensors and Actuators A, 37-38 (1993), pp. 216-220.
Des Gibson et al.; "Durable infrared optical coatings based on pulsed DC-sputtering of hydrogenated amorphous carbon"; Applied Optics, Mar. 20, 2020, vol. 59, No. 9, pp. 2731-2738.
Lan et al.; "Platinum containing amorphous hydrogenated carbon (a-C:H/Pt) thin films as selective solar absorbers"; Applied Surface Science 316 (2014), pp. 398-404.
Hirota et al.; "120 90 element thermoeletric infrared focal plane array with precisely patterned Au-black absorber", Sensors and Actuators A 135 2007, pp. 146-151.
Jutzi et al.; "Far-infrared sensor with LPCVD-deposited low-stress Si-rich nitride absorber membrane Part 2: Thermal property, and sensitivity", Sencors and Actuators A: Physical, A 152, 2009, pp. 126-138.
Lang et al.; "Absorbing layers for thermal infrared detectors"; Sensors and Actuators A, 34, 1992, pp. 243-248.
Lenggenhager et al.; "Thermoelectric Infrared Sensors by CMOS Technology"; IEEE Electron Device Letters, vol. 13, No. 9, Sep. 1992, pp. 454-456.
Xu, et al.; "Design, fabrication and characterization of a front-etched micromachined thermopile for IR detection", Journal of Micromechanics and Microengineering, 20, 2010, 115004, 10 pages.

* cited by examiner depositing carbon to form at least one of the first layer and the second layer sputtering the carbon

402 controlling the hydrogenation of the carbon during sputtering to control the absorption characteristics of the first layer and/or the second layer

404

400

ABSORBER, A DETECTOR COMPRISING THE ABSORBER, AND A METHOD OF FABRICATING THE ABSORBER

CROSS REFERENCE TO RELATED APPLICATIONS

This application is a national stage entry of International Application No. PCT/GB2021/052388 filed on Sep. 15, 2021, which claims priority from United Kingdom Application No. 2016210.3 filed on Oct. 13, 2020, the contents of each of which are incorporated by reference herein in its entirety.

BACKGROUND

1. Field of the Disclosure

The present disclosure relates to an absorber for absorbing electromagnetic radiation, and a method of fabricating the absorber. In particular, the present disclosure relates to an absorber for use in an electromagnetic radiation detector, that may, for example, be used to detect electromagnetic radiation at infrared wavelengths.

2. Description of the Related Art

FIG. 1 is a schematic of a thermopile 100 that is configured to function as a thermopile infrared (IR) detector. The thermopile 100 may be referred to as a thermopile chip. The thermopile 100 comprises a substrate 102, supporting layers and/or passivation layers 104 and an absorber 110. In FIG. 1(*a*), three layers form the supporting and/or passivation layers 104. Thermopile infrared (IR) detectors may be used as sensing elements for non-contact infrared thermometers. Supporting layers are used to support the absorber 110 and passivation layers may be used as part of the lift off process that is used to define the overall structure.

In operation, IR radiation that is incident on the thermopile 100 is absorbed by the absorber 110, resulting in the absorber increasing in temperature. This results in temperature difference arising between a hot junction 112 and a cold junction 114. Based on the Seebeck effect, the thermopile 100, which comprises a plurality of thermocouples (not shown), transforms the temperature difference between the hot and cold junctions 112, 114 into an output voltage.

It will be appreciated that the hot junction 112 refers to the general area including the absorber 110 and immediately surrounding the absorber 110, whereas the cold junction 114 refers to an area outside the hot junction 112 region. In effect the hot junction 112 and cold junction 114 are general areas showing temperature difference, with the hot junction 112 being the warmer of the two areas when radiation is absorbed, thereby resulting in the required temperature difference for operation of the thermopile 100.

Silicon, a primary substrate material, is used in many microelectromechanical systems (MEMS) based thermopile devices, such as the thermopile 100, due to its low cost and complementary metal oxide semiconductor (CMOS) processing compatibility. The substrate 102 of the thermopile 100 is silicon and may be provided as a semiconductor wafer.

A porous metal (named "metal black", such as gold-black, silver-black, and platinum-black) is typically used as the absorber 100. Metal black can exhibit high absorption properties (>90%) and a wide absorption band. Metal black absorbers are presented in "Absorbing layers for thermal infrared detectors; W. Lang, K. Kuhl, H. Sandnaier; Sens. Actuators, A 34 (1992) 234-248" and "120×90 element thermoelectric infrared focal plane array with precisely patterned Au-black absorber; M. Hirota, Y. Nakajima, M. Saito, M. Uchiyama; Sense. Actuators, A 135 (2007) 146-161.

However, porous metals such as metal black are easily destroyed by contact, they difficult to pattern and they are incompatible with CMOS processing because their dendritic and soft structures make them too fragile for standard techniques like lithography and etching. Furthermore, their preparation process is much complex and costly.

A silicon nitride ($Si_3N_4$) layer, a silicon dioxide layer ($SiO_2$) layer or a sandwich film structure comprising a silicon nitride layer sandwiched between two silicon dioxide layers ($SiO_2$/$Si_3N_4$/$SiO_2$) is also often used as the absorber 110 of the thermopile 100. Such a structure may be referred to as a "membrane". However, such a membrane provides low IR absorption and a narrow spectral absorption range thereby inhibiting its usefulness for IR detection. Additionally, these membranes are difficult to pattern and are not compatible with CMOS; the dendritic and soft structures make them too fragile for standard CMOS techniques like lithography and etching. Furthermore, their preparation process is complicated and costly.

Examples of such membranes are presented in "Thermoelectric infrared sensors by CMOS technology; R. Lenggenhager, H. Baltes, J. Peer, M. Forster; IEEE Electron Device Lett. 13 (1992) 454-456", "Far-infrared sensor with LPCVD-deposited low stress Si-rich nitride absorber membrane; F. Jutzi, D. H. B. Wicaksono, G. Pandraud, N. de Rooij, P. J. French; Part 2. Thermal property, and sensitivity, Sens. Actuators, A 152 (2009)" and "Design, fabrication and characterization of a front etched micromachined thermopile for IR detection, D. H. Xu, B. Xiong, Y. L. Wang, J. Micromech. Microeng. 20 (2010) 115004".

SUMMARY

It is desirable to provide an absorber suitable for detection of electromagnetic radiation, such as an IR detector for a thermopile, that overcomes or mitigates one or more of the above mentioned problems.

According to a first aspect of the disclosure there is provided an absorber for absorbing electromagnetic radiation comprising a first layer comprising hydrogenated carbon, and a second layer comprising carbon, wherein the first layer is less absorbing than the second layer.

Optionally, the second layer comprises non-hydrogenated carbon.

Optionally, the first layer is an anti-reflection layer, and/or the second layer is an absorbing layer.

Optionally, the absorber is for absorbing electromagnetic radiation at infrared wavelengths.

Optionally, the absorber is for absorbing electromagnetic radiation within a wavelength range of 2 μm to 18 μm.

Optionally, the absorber is for absorbing electromagnetic radiation within a wavelength range of 5 μm to 12 μm.

Optionally, the absorber is configured to be a broadband absorber.

Optionally, the first layer coats a surface of the second layer.

Optionally, the first layer and the second layer form a free standing structure.

Optionally, the absorber comprises one or more intermediate layers, wherein the one or more intermediate layers are sandwiched between the first layer and the second layer.

Optionally, the hydrogen content of the first layer is greater than the hydrogen content of the one or more intermediate layers.

Optionally, the hydrogen content of the one or more intermediate layers decreases successively from the first layer to the second layer.

Optionally, the first layer, the second layer and the one or more intermediate layers form a free standing structure.

Optionally, the absorber comprises a substrate.

Optionally, the absorber comprises a membrane.

According to a second aspect of the disclosure there is provided a detector for detecting electromagnetic radiation comprising an absorber having the features of the absorber of the first aspect.

Optionally, the detector comprises a CMOS chip, wherein the CMOS chip comprises the absorber.

Optionally, the detector comprises a heat sensitive element configured to detect heating of the absorber when it absorbs electromagnetic radiation.

Optionally, the detector is configured as a thermopile.

Optionally, the detector is configured to function as at least one of an infrared thermometer, an image sensor, and a gas sensor.

According to a third aspect of the disclosure there is provided a method of fabricating an absorber having the features of the absorber of the first aspect, comprising depositing carbon to form at least one of the first layer and the second layer.

Optionally, depositing carbon comprises sputtering the carbon.

Optionally, sputtering the carbon comprises pulsed DC sputtering.

Optionally, the method comprises controlling the hydrogenation of the carbon during sputtering to control the absorption characteristics of the first layer and/or the second layer.

Optionally, the absorber is fabricated in a single pulsed DC sputtering process, the first and second layers being fabricated by the controlling of the hydrogenation of the carbon during sputtering.

BRIEF DESCRIPTION OF THE DRAWINGS

The disclosure is described in further detail below by way of example only and with reference to the accompanying drawings in which.

DETAILED DESCRIPTION

Figure 1:
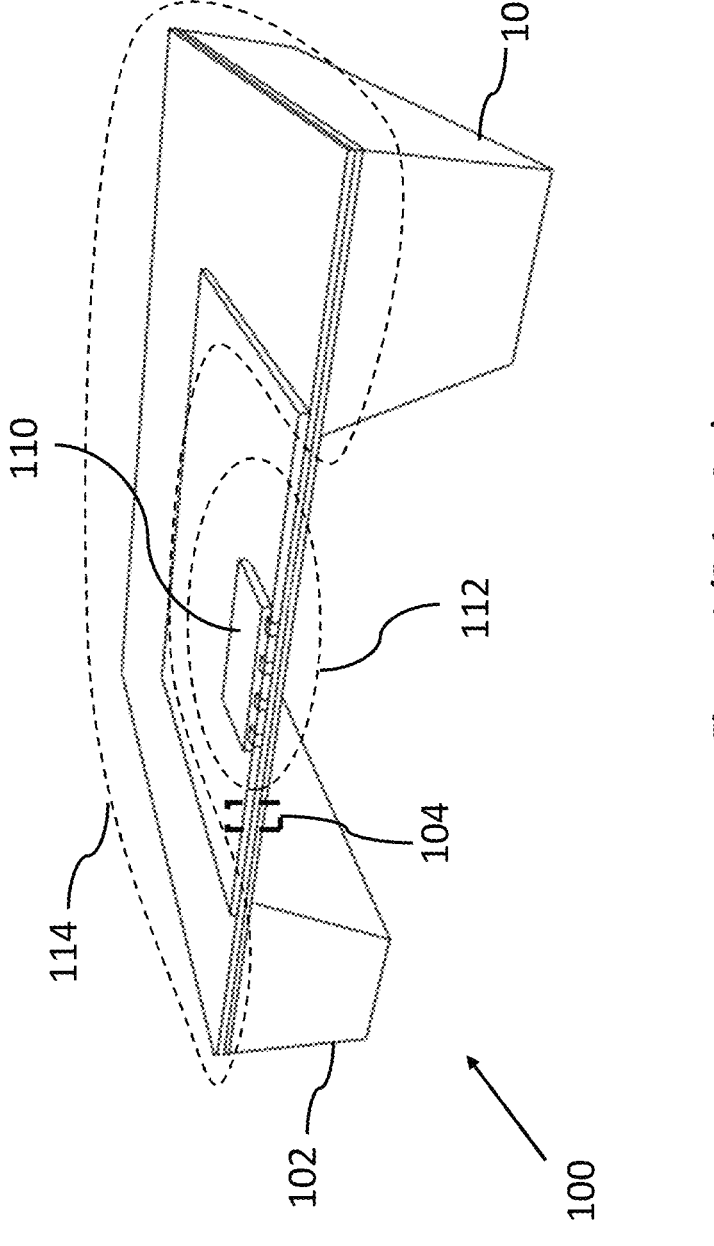
FIG. 1 is a schematic of a thermopile that is configured to function as a thermopile infrared (IR) detector.

FIG. 2(a) is a schematic of an absorber 200 for absorbing electromagnetic radiation in accordance with a first embodiment of the present disclosure. The absorber 200 comprises a first layer 202 comprising hydrogenated carbon and a second layer 204 comprising carbon. The first layer 202 is less absorbing than the second layer 204.

The relationship between hydrogen content of the carbon and the complex refractive index, comprising "n" and "k" values, is described for a wavelength range of 2 μm to 12 μm in "Durable infrared optical coatings based on pulsed DC-sputtering of hydrogenated amorphous carbon (a-C:H); Des Gibson et. al.; Applied Optics, Vol. 59, No. 9, 20 Mar. 2020". "n" is usually referred to as the refractive index and "k" is usually referred to as the extinction coefficient.

In the present embodiment, the first layer 202 is in contact with the second layer 204. The first layer 202 may be described as coating the second layer 204. It will be appreciated that in a further embodiment there may be one or more intermediate layers between the first and second layers 202, 204.

Hydrogenated carbon comprises both hydrogen and carbon, and may be referred to as hydrogenated amorphous carbon (a-C:H). In a preferred embodiment, the absorber 200 is for absorbing electromagnetic radiation at infrared (IR) wavelengths. The absorber 200 may be configured to be absorbing within a wavelength range of 1 μm to 50 μm. Preferably, the absorber 200 is for absorbing IR radiation within a wavelength range of 2 μm to 18 μm, or specifically, a wavelength range of 5 μm to 12 μm.

In a specific embodiment, the absorber 200 may function as a narrowband absorber that absorbs a single narrowband wavelength, for example, in one of the wavelength ranges previously described. In a further embodiment, the absorber 200 may function as a broadband absorber that absorbs over a band of wavelengths, for example, in one of the wavelength ranges previously described. In a further embodiment, the absorber 200 may function as a multiband absorber that absorbs multiple wavelengths each over a range, where each range may, for example, be one of, or be within one of, the wavelength ranges previously described.

The inclusion of hydrogenated carbon in the first layer 202 results in the first layer 202 being less absorbing to IR radiation than the second layer 204. It will be appreciated that in a further embodiment, the second layer 204 may also comprise hydrogenated carbon, with a greater hydrogen content being present in the first layer 202 such that the first layer 202 is less absorbing than the second layer 204. In a further embodiment, the second layer may comprise non-hydrogenated carbon, having no hydrogen content. Greater hydrogen content in the carbon decreases absorption with a non-linear trend.

The first layer 202 may be an anti-reflection layer and the second layer 204 may be an absorbing layer, with incident electromagnetic radiation being transmitted through the first layer 202 and absorbed by the second layer 204. The first layer 202 may be referred to as a low absorbing carbon layer and the second layer 204 may be referred to as an absorbing carbon layer. It will be appreciated that in a practical implementation of the absorber 200, the layers 202, 204 are unlikely to exhibit idealised optical properties. For example, the first layer 202 may reflect part of the incident electromagnetic radiation and the second layer 204 may not absorb all incident electromagnetic radiation.

In a preferred embodiment, the first layer 202 functions as an anti-reflection layer that maximises transmission into the absorbing second layer 204, and minimises reflections. Controlling the hydrogen content of the first layer 202 can be used to tune its anti-reflection properties through variation in its complex refractive index.

The first layer 202 and the second layer 204 may form a free standing structure that is self-supporting and does not use a substrate to maintain its shape and structural integrity.

FIG. 2(b) is a schematic of an absorber 206 in accordance with a second embodiment of the present disclosure.

In the present embodiment, there is a plurality of intermediate layers 208 between the first and second layers 202, 204. The intermediate layers comprise hydrogenated carbon, with the hydrogen content of the hydrogenated carbon decreasing with each subsequent layer from the first layer 202, through the intermediate layers 208 to the second layer 204. This, in effect, forms a graded absorber structure. It will be appreciated that in further embodiments there may be a single intermediate layer rather than multiple intermediate layers 208. Also, in a further embodiment the hydrogen content may not decrease with each subsequent layer from the first layer 202 to the second layer 204, but may remain constant or increase across different layers. Controlling the hydrogen content of the different layers 202, 204, 208 can be used to engineer desirable optical properties for different applications.

FIG. 2(c) is a schematic of an absorber 210 comprising a substate 212, and in accordance with a third embodiment of the present disclosure. The second layer 204 of the absorber 210 is on a surface of the substrate 212. It will be appreciated that in further embodiments there may be one or more additional layers between the second layer 204 and the substrate 212.

In the present embodiment, and with reference to the drawing, the absorber 210 is arranged such that electromagnetic radiation may be incident from above, such that the radiation would encounter the first layer 202 before passing through to the second layer 204. In a further embodiment the first layer 202, rather than the second layer 204 may be in contact with the substrate 212, such that incident electromagnetic radiation would pass through the substrate 212 before encountering the first layer 202. It will be appreciated that, similarly, there may be a suitable layer, or layers, between the first layer 202 and the substrate 212.

To permit transmission of incident electromagnetic radiation through the substrate 212, the substrate 212 should be capable of transmission at the wavelength, or range of wavelengths, to be absorbed by the absorber 210. The substrate 212 may have appropriate optical properties to provide this capability or may alternatively include gaps in the substrate material to permit transmission, for example by back etching a silicon substrate after fabrication of the absorber layers.

FIG. 2(d) is a schematic of an absorber 214 in accordance with a fourth embodiment of the present disclosure. In the present embodiment, the absorber 214 comprises a membrane 216. The membrane 216 may comprise one or more of silicon dioxide ($SiO_2$) and silicon nitride ($Si_3N_4$). For example, the membrane 216 may comprise a single layer of silicon nitride. The membrane 216 may comprise distinct layers, for example a silicon dioxide layer and a silicon nitride layer. The membrane 216 may comprise a sandwich film structure comprise one layer sandwiched between two other layers. For example, the sandwich film structure may be a silicon nitride layer sandwiched between two silicon dioxide layers ($SiO_2/Si_3N_4/SiO_2$). The use of multiple layers is designed to reduce stress in the membrane 216. The thickness of the membrane 216 may typically be up to 2 μm.

The membrane 216 may function to provide at least one of support, insulation and passivation to the rest of the absorber 214. Specifically, the membrane 216 may provide physical support, thereby providing structural strength; insulation to prevent uncontrolled heat leakage from the absorber 214; and passivation as part of pattern definition during fabrication of the absorber 214.

Additionally, the membrane 216 itself may contribute to the electromagnetic radiation absorption characteristics of the absorber 214.

FIG. 2(e) is a schematic of an absorber 218 in accordance with a fifth embodiment of the present disclosure. The absorber 218 corresponds to the absorber 214 and shows a specific implementation of the membrane 216. In the present embodiment the membrane comprises alternating layers of material, for example silicon dioxide and silicon nitride.

FIG. 2(f) is a schematic of an absorber 220 in accordance with a sixth embodiment of the present disclosure. In the present embodiment the absorber 220 comprises the substrate 212 and the membrane 216 functions as an intermediate layer between the first and second layers 202, 204 and the substrate 202.

Each of the absorbers described herein comprise a plurality of layers, thereby forming a multilayer structure. It will be appreciated that each of these layers as described may not be in direct contact with each other. For example, intermediate layers may be present between the layers as previously described, without substantially impacting on the electromagnetic radiation absorption characteristics of the absorber.

The absorbers presented herein are CMOS compatible and therefore may be implemented using CMOS processing technology, thereby overcoming a shortcoming of metal black. Furthermore, the absorbers described herein may function as durable broadband absorbers. Specifically, combining a broadband absorption carbon layer (the second layer 204) with a low absorption anti-reflective (the first layer 202) overcoat can provide high broadband IR absorption (>90%) with minimal IR reflection.

The absorbers of the present disclosure may function as broadband infrared absorbers for use in MEMS based CMOS thermopile devices.

Figure 3:
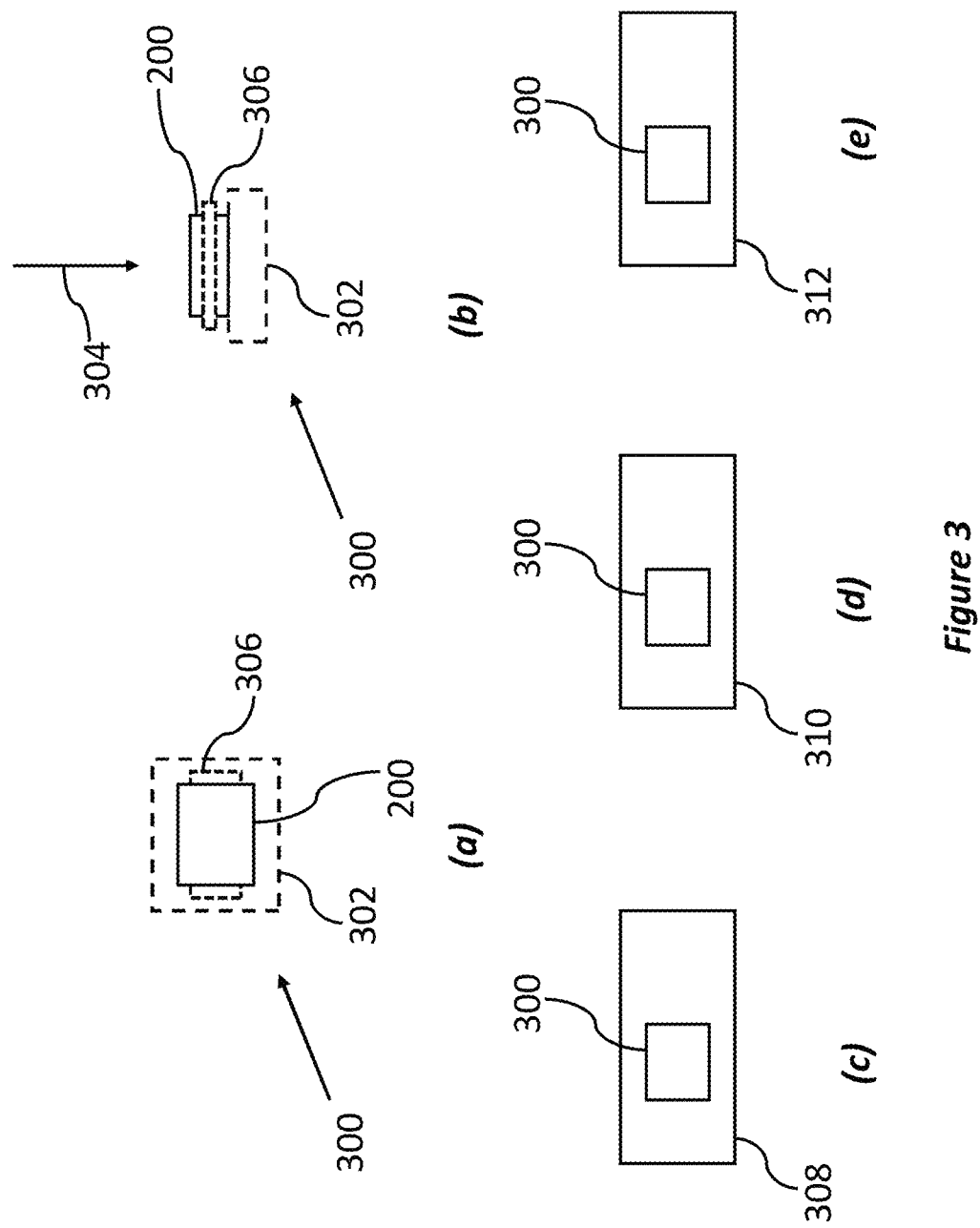
FIG. 3(a) is a schematic of a detector for detecting electromagnetic radiation in accordance with a seventh embodiment of the present disclosure.
FIG. 3(b) is a cross section of the detector of FIG. 3(a)
FIG. 3(c) is a schematic of an infrared thermometer.
FIG. 3(d) is a schematic of an image sensor.
FIG. 3(e) is a schematic of a gas sensor.

FIG. 3(a) is a schematic of a detector 300 for detecting electromagnetic radiation and comprising the absorber 200, and in accordance with a seventh embodiment of the present disclosure. It will be appreciated that the absorber 200 may alternatively be any of the absorbers as described herein, and in accordance with the understanding of the skilled person. The detector 300 may comprise a CMOS chip 302, which may comprise the absorber 200.

FIG. 3(b) is a cross section of the detector 300 of FIG. 3(a). In the present example electromagnetic radiation 304, such as IR radiation, is incident on the detector 300 from above. Although not illustrated here, it will be appreciated that in accordance with the previous description of the absorber 200, the incident radiation 304 will encounter the first layer 202 (not shown) of the absorber 200, before passing to the second layer 204 (not shown) and being absorbed.

The detector 300 may further comprise a heat sensitive element 306 for detecting heating of the absorber 200 when it absorbs electromagnetic radiation. The detector 300 may be configured to function as a thermopile or a pyroelectric detector. It will be appreciated that the absorber 200 of a thermopile may require different broadband absorption properties than the absorber 200 of a pyroelectric detector.

With reference to FIG. 1, the detector 300 may be configured to function as the thermopile 100 with an absorber of the present disclosure (such as the absorber 200) corresponding to the absorber 110. For an absorber comprising the membrane 216, the membrane 216 can provide support to the hot junction and the rest of the absorber.

It will be appreciated that the detector 300 may comprise a plurality of absorbers 200. These absorbers 200 may correspond to one or more of the absorbers as described herein.

FIG. 3(c), FIG. 3(d) and FIG. 3(e) are schematics of an infrared thermometer 308, an image sensor 310 and a gas sensor 312, respectively. Each of the infrared thermometer 308, the image sensor 310 and the gas sensor 312 comprise the detector 300 for detecting electromagnetic radiation.

It will be appreciated that the detector 300 may comprise a plurality of absorbers 200. These absorbers 200 may correspond to one or more of the absorbers as described herein. In the image sensor 310, for example, this may enable multipixel imaging.

The infrared thermometer 308 may, for example, be a non-contact infrared thermometer that may be used for thermopile based remote thermometry. The image sensor 310 may, for example, be an uncooled thermal imager. The gas sensor 312 may, for example, be a nondispersive infrared (NDIR) gas detector.

Figure 4:
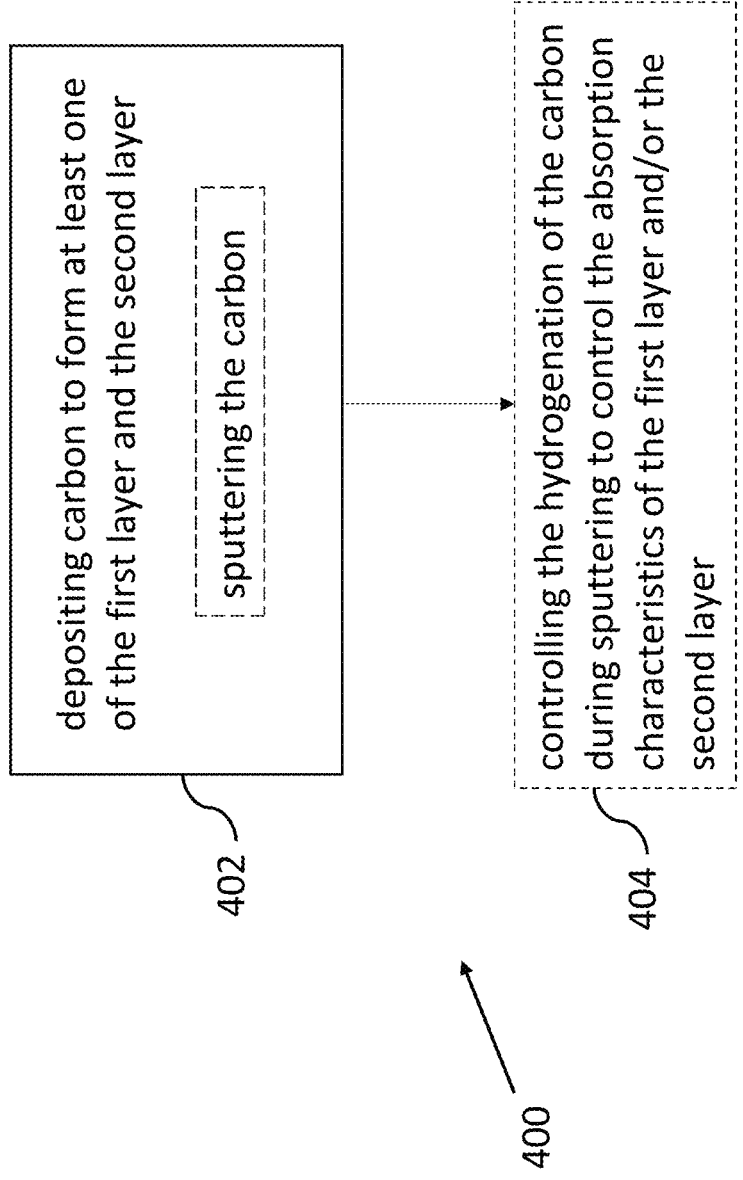
FIG. 4 is a flow chart of a method of fabricating an absorber of the present disclosure, in accordance with an eighth embodiment of the present disclosure.

FIG. 4 is a flow chart of a method 400 of fabricating an absorber of the present disclosure, in accordance with an eighth embodiment of the present disclosure. The following description will refer to the absorber 200, however the method 400 may be applied to fabricate any of the absorbers described herein, in accordance with the understanding of the skilled person.

The method 400 comprises depositing carbon to form at least one of the first layer 202 and the second layer 204, at a step 402. The deposition of carbon may comprises sputtering the carbon, for example using pulsed DC sputtering. Pulsed DC sputtering can be used to fabricate the first layer 202 as a durable anti-reflection coating.

The method 400 may comprise controlling the hydrogenation of the carbon during sputtering to control the absorption characteristics of the first layer 202 and/or the second layer 204, at a step 404. In a preferred embodiment, the absorber 200 is fabricated is a single pulsed DC sputtering process, the first and second layers 202, 204 being fabricated by the controlling of the hydrogenation of the carbon during sputtering.

The method 400 may use pulsed DC sputtering of carbon with controlled hydrogenation during deposition, thereby enabling control of the carbon absorption characteristics, for example at infrared wavelengths within a wavelength range of 1 μm to 50 μm. Controlled introduction of hydrogen during deposition enables control of the spatial absorption distribution through the carbon coating (the first layer 202) and can be used to achieve an optimised combination of reduced reflectance from the first layer 202 and maximised absorption in the second layer 204.

In a preferred embodiment, the method 400 may be performed using the procedure described in "Durable infrared optical coatings based on pulsed DC-sputtering of hydrogenated amorphous carbon (a-C:H); Des Gibson et. al.; Applied Optics, Vol. 59, No. 9, 20 Mar. 2020", as is summarised below. The deposition procedure will be described with respect to the absorber 210, however it will be appreciated that the process may be applied to any of the other absorber embodiments described herein, in accordance with the understanding of the skilled person.

The deposition of carbon to form the absorber 210 was carried out using a pulsed DC reactive sputtering process. Microwave plasma was used to pre-condition the chamber to reduce water content and to pre-clean the substrate 212. Deposition was performed using a high throughput drum-based sputter system that provides capacity for processing up to forty 6-inch wafers per deposition run. Room temperature sputter deposition technology as provided by the drum-based sputter system described herein can provide significantly higher throughput than existing. high temperature chemical vapour deposition techniques. Peak temperature during deposition was found not to exceed 70° C. A magnetron target having a size of 374 mm×120 mm was used.

A summary of the deposition conditions are provided below:

| Parameter | Value |
| --- | --- |
| Ar flow (sccm) | 100 |
| $H_2$ flow (sccm) | 0 to 18 |
| Gas purities (%) | 99.99 |
| Process pressure (mBar) | $5 \times 10^{-3}$ |
| Base pressure (mBar) | $5 \times 10^{-7}$ |
| Power (kW) | 4 |
| Current (A) | 10 |
| Voltage (V) | 400 |
| Pulsed DC frequency (kHz) | 46 |
| Pulse duration (μs) | 4 |
| Reverse pulse (as percentage of forward pulse voltage) (%) | 20 |
| Deposition rate (Å/s) | 0.3 |
| Target purity (%) | 99.99 |
| Preclean microwave plasma power (kW) | $3^d$ |
| Chamber preconditioning and substrate preclean time (mins) | 30 |
| Thickness (nm) | 200-1200 |

Controlling the hydrogen ($H_2$) flow rate is used to control the hydrogen content of the carbon. For example, the hydrogen flow rate may be used to tune the anti-reflection properties of the first layer 202.

In a preferred embodiment, the second layer 204 is produced using a hydrogen flow rate of 0 sccm, with the first layer 202 being produced using a hydrogen flow rate having a value ranging from 3 sccm to 10 sccm. The first layer 202 may have a thickness having a value within a range from 0.5 μm to 1 μm and the second layer 204 may have a thickness having a value within a range from 2 μm to 5 μm.

It will be appreciated that the other absorbers of the present disclosure may fabricated using this process in accordance with the understanding of the skilled person. For example, the substrate 212 may be partially or fully etched such that the first layer 202 and the second layer 204 may form a free standing structure. Also the intermediate layers 208 of the absorber 206 may be fabricated by controlling the hydrogen flow rate accordingly.

It will be appreciated that the fabrication procedure of forming the first and second layers 202, 204 may be a single continuous process where the second layer 204 is formed, followed by the first layer 202, by adjusting the hydrogen flow rate. This corresponds to the single pulsed DC sputtering process as discussed previously.

Similarly, the other absorbers of the present disclosure may be fabricated using a single continuous process in accordance with the understanding of the skilled person. For example, the absorber 206 may have the first, second and intermediate layers 202, 204, 208 formed in a single continuous process by adjusting the hydrogen flow rate. This provides an efficient and high throughput fabrication process as intermediate steps are not required for the fabrication of each layer.

Additionally, as the absorbers presented herein are CMOS compatible, the fabrication process offers an efficient means of fabricating absorbers for use in IR detectors, such as thermopiles.

Figure 5:
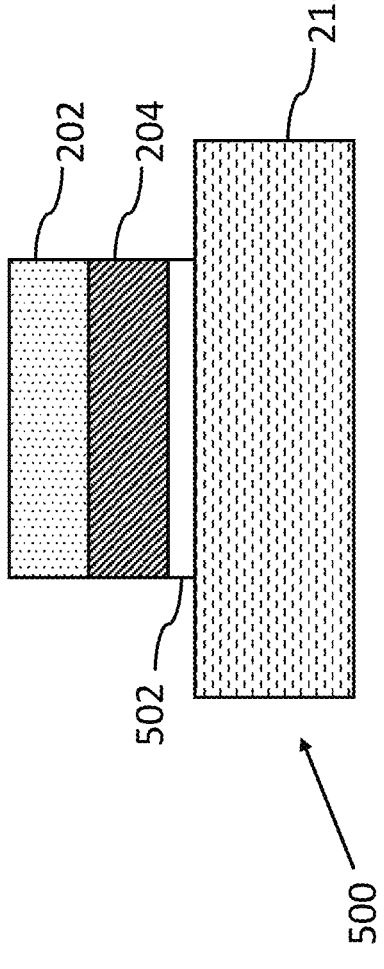
FIG. 5 is a schematic of an absorber in accordance with a ninth embodiment of the present disclosure.

FIG. 5 is a schematic of an absorber 500 in accordance with a ninth embodiment of the present disclosure. The absorber 500 corresponds to the absorber 210, but further comprises an adhesion promoting layer 502. The adhesion promoting layer 502 may be deposited on the substrate 212 prior to deposition of the second layer 204. The adhesion promoting layer 502 aids the adhesion of the second layer 204 to the substrate 212. In a further embodiment, where the membrane 216 is present, the adhesion promoting layer 502 may be deposited on a surface of the membrane 216 to aid adhesion of the second layer 204 to the membrane 216.

The adhesion promoting layer 502 may comprise carbon and be fabricated using the deposition method as previously described. In a further embodiment, the adhesion promoting layer 512 may comprise metal, for example chromium or aluminium, Chromium or aluminium can aid adhesion of the second layer 204 to a silicon dioxide surface (for example of the membrane 216).

Silicon nitride does not require the adhesion promoting layer 502 to aid adhesion with the second layer 204, due to the presence of carbon bonds provided by the second layer 204.

An advantage of having the adhesion promoting layer 512 comprising a reflective material, such as a metal, is potential improvement in broadband absorption performance as radiation transmitted through the second layer 204 is reflected back through the second layer 204 further increasing absorption of the absorber 500.

Figure 6:
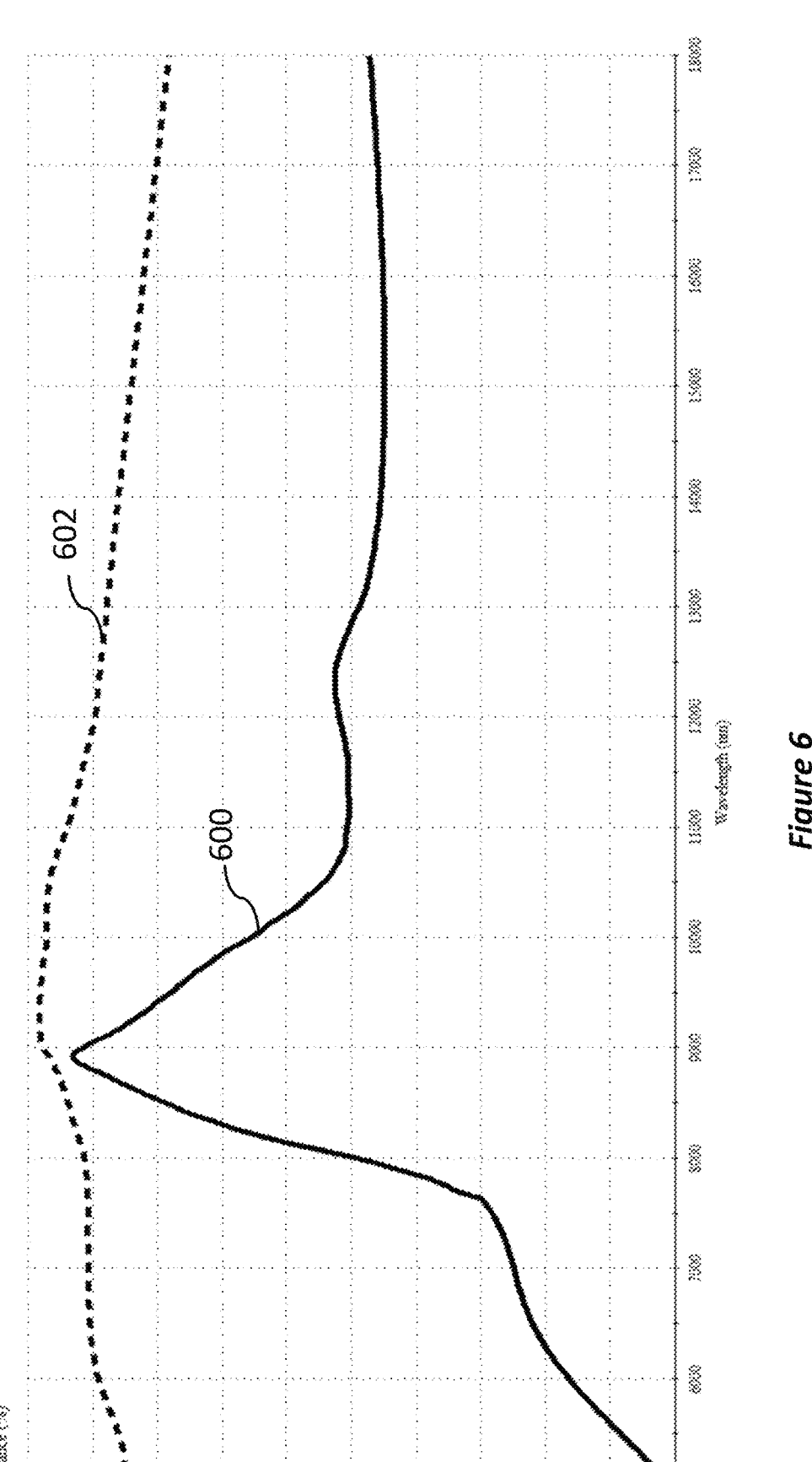
FIG. 6 is a graph showing simulation results of the absorptance versus wavelength for an absorber and a membrane.

FIG. 6 is a graph showing simulation results of the absorptance versus wavelength for an absorber 600 and a membrane 602. The simulated membrane 602 comprises the following layer structure:

| Layer | Material | Refractive Index | Extinction Coefficient | Optical Thickness (FWOT) | Physical Thickness (nm) |
|---|---|---|---|---|---|
| Medium | Air | 1 | 0 | | |
| 1 | Si₃N₄ | 1.6 | 1.1 | 0.1184 | 740 |
| 2 | SiO₂ | 2.694 | 0.509 | 0.15355804 | 570 |
| 3 | Si₃N₄ | 1.6 | 1.1 | 0.024 | 150 |
| 4 | SiO₂ | 2.694 | 0.509 | 0.17511004 | 650 |
| Substrate | Air | 1 | 0 | | |

The simulated absorber comprises the following layer structure:

| Layer | Material | Refractive Index | Extinction Coefficient | Optical Thickness (FWOT) | Physical Thickness (nm) |
|---|---|---|---|---|---|
| Medium | Air | 1 | 0 | | |
| 1 | Hydrogenated carbon (C—H, 3 sccm H₂ flow) | 2.01435 | 0.01877 | 0.12811236 | 636 |
| 2 | Carbon (sputtered carbon) | 2.1 | 1 | 0.42 | 2000 |
| 3 | Si₃N₄ | 1.6 | 1.1 | 0.1184 | 740 |
| 4 | SiO₂ | 2.694 | 0.509 | 0.15355804 | 570 |
| 5 | Si₃N₄ | 1.6 | 1.1 | 0.024 | 150 |
| 6 | SiO₂ | 2.694 | 0.509 | 0.17511004 | 650 |
| Substrate | Air | 1 | 0 | | |

The absorber 600 and membrane 602 layer structures are representative of practical implementations of these components.

Figure 2:
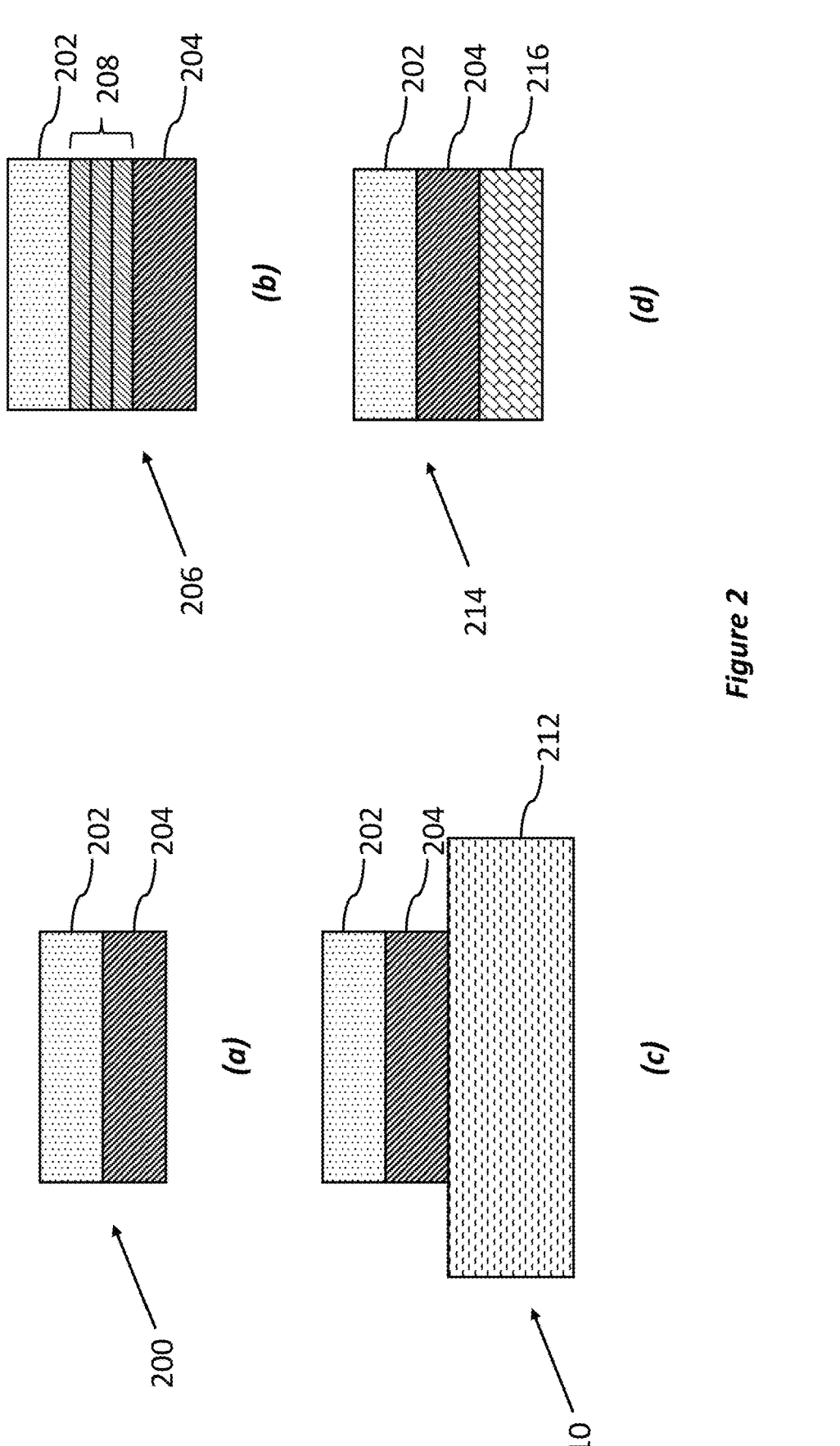
FIG. 2(a) is a schematic of an absorber for absorbing electromagnetic radiation in accordance with a first embodiment of the present disclosure.
FIG. 2(b) is a schematic of an absorber in accordance with a second embodiment of the present disclosure.
FIG. 2(c) is a schematic of an absorber in accordance with a third embodiment of the present disclosure.
FIG. 2(d) is a schematic of an absorber in accordance with a fourth embodiment of the present disclosure.
FIG. 2(e) is a schematic of an absorber in accordance with a fifth embodiment of the present disclosure.
FIG. 2(f) is a schematic of an absorber in accordance with a sixth embodiment of the present disclosure.
Figure 2:
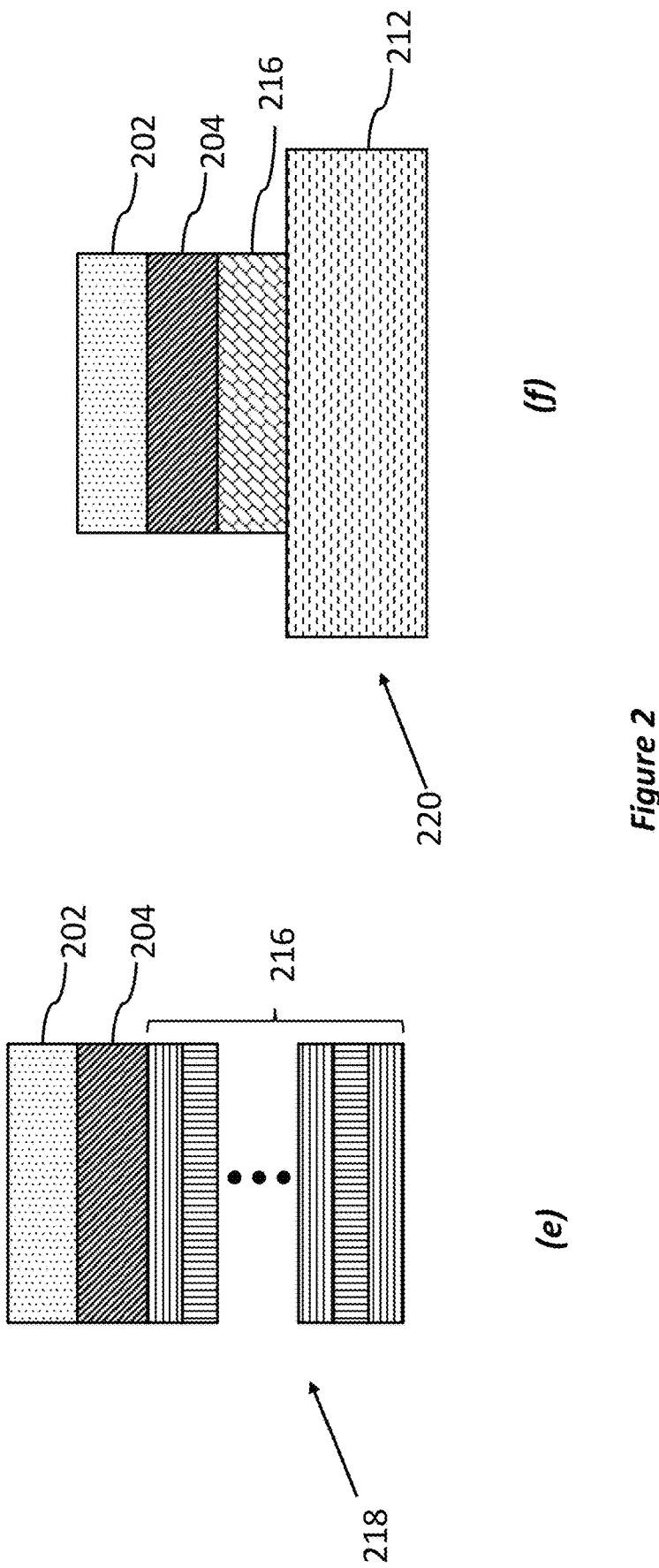

The absorber 600 may be understood with reference to the absorber 218 of FIG. 2(*e*) as previously described. Specifically, the first layer 202, the second layer 204 and the membrane 216 of the absorber 218 may correspond to layer 1, layer 2 and layers 3 to 6 of the absorber 600, respectively.

The absorber 600 layer structure is the same as the membrane 602 layer structure, with the addition of the carbon overlayer formed by the hydrogenated carbon (layer 1 of the absorber 600) and the carbon (layer 2 of the absorber 600).

It will be appreciated that common reference numerals and variables between Figures have been used to represent common features.

Various improvement and modifications may be made to the above without departing from the scope of the disclosure.

The invention claimed is:

1. An absorber for absorbing electromagnetic radiation comprising:
   a first layer comprising hydrogenated carbon;
   a second layer comprising carbon; and
   one or more intermediate layers;
   wherein:
   the one or more intermediate layers are sandwiched between the first layer and the second layer;
   the first layer is less absorbing than the second layer;
   the first layer is an anti-reflection layer;
   the second layer is an absorbing layer;
   the first layer has a hydrogen content that is greater than the hydrogen content of the second layer;
   the first layer has a hydrogen content that is greater than the hydrogen content of the one or more intermediate layers; and
   the one or more intermediate layers has a hydrogen content that decreases successively from the first layer to the second layer.

2. The absorber of claim 1, wherein the second layer comprises non-hydrogenated carbon.

3. The absorber of claim 1, wherein the absorber is for absorbing electromagnetic radiation at infrared wavelengths.

4. The absorber of claim 3, wherein the absorber is for absorbing electromagnetic radiation within a wavelength range of 2 μm to 18 μm.

5. The absorber of claim 3, wherein the absorber is for absorbing electromagnetic radiation within a wavelength range of 5 μm to 12 μm.

6. The absorber of claim 1, wherein the absorber is configured to be a broadband absorber.

7. The absorber of claim 1, wherein the first layer, the second layer and the one or more intermediate layers form a free standing structure.

8. The absorber of claim 1, further comprising a substrate or a membrane.

9. A detector for detecting electromagnetic radiation comprising:

an absorber for absorbing electromagnetic radiation comprising:

a first layer comprising hydrogenated carbon;

a second layer comprising carbon; and one or more intermediate layers;

wherein:

the one or more intermediate layers are sandwiched between the first layer and the second layer;

the first layer is less absorbing than the second layer;

the first layer is an anti-reflection layer;

the second layer is an absorbing layer;

the first layer has a hydrogen content that is greater than the hydrogen content of the second layer;

the first layer has a hydrogen content that is greater than the hydrogen content of the one or more intermediate layers; and the one or more intermediate layers has a hydrogen content that decreases successively from the first layer to the second layer.

10. The detector of claim 9, further comprising a CMOS chip, wherein the CMOS chip comprises the absorber.

11. The detector of claim 9, further comprising a heat sensitive element configured to detect heating of the absorber when it absorbs electromagnetic radiation.

12. A method of fabricating an absorber for absorbing electromagnetic radiation, the absorber comprising:

a first layer comprising hydrogenated carbon;

a second layer comprising carbon; and one or more intermediate layers;

wherein:

the one or more intermediate layers are sandwiched between the first layer and the second layer;

the first layer is less absorbing than the second layer;

the first layer is an anti-reflection layer;

the second layer is an absorbing layer;

the first layer has a hydrogen content that is greater than the hydrogen content of the second layer;

the first layer has a hydrogen content that is greater than the hydrogen content of the one or more intermediate layers; and the one or more intermediate layers has a hydrogen content that decreases successively from the first layer to the second layer, the method comprising:

depositing carbon to form at least one of the first layer and the second layer.

13. The method of claim 12, wherein depositing carbon comprises sputtering the carbon.

14. The method of claim 13, comprising:

controlling the hydrogenation of the carbon during sputtering to control the absorption characteristics of the first layer and/or the second layer.

15. The method of claim 14, wherein the absorber is fabricated in a single pulsed DC sputtering process, and wherein the first and second layers are fabricated by the controlling of the hydrogenation of the carbon during sputtering.

\* \* \* \* \*